United States Patent
Wang et al.

(10) Patent No.: US 9,431,963 B2
(45) Date of Patent: Aug. 30, 2016

(54) DUAL STAGE LOW NOISE AMPLIFIER FOR MULTIBAND RECEIVER

(71) Applicant: QUALCOMM Incorporated, San Diego, CA (US)

(72) Inventors: Chuan Wang, San Diego, CA (US); Dongling Pan, San Diego, CA (US); Wing Fat Andy Lau, San Diego, CA (US); Jorge Andres Garcia, San Diego, CA (US); David Zixiang Yang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/491,833

(22) Filed: Sep. 19, 2014

(65) Prior Publication Data

US 2016/0087587 A1    Mar. 24, 2016

(51) Int. Cl.
| | |
|---|---|
| *H04B 7/00* | (2006.01) |
| *H03F 1/02* | (2006.01) |
| *H03F 3/19* | (2006.01) |
| *H03F 1/26* | (2006.01) |
| *H04B 1/00* | (2006.01) |

(52) U.S. Cl.
CPC ............. *H03F 1/0205* (2013.01); *H03F 1/26* (2013.01); *H03F 3/19* (2013.01); *H04B 1/005* (2013.01); *H03F 2200/294* (2013.01); *H03F 2200/451* (2013.01)

(58) Field of Classification Search
CPC .......... H03F 3/211; H03F 1/32; H03F 3/602; H03F 2200/451; H03F 3/38; H03F 1/565; H03F 2200/294; H03F 2200/372; H03F 3/68; H03F 3/195; H03F 2200/111; H03F 2200/198; H03F 2200/541

USPC ............ 455/127.1, 241.1, 245.2; 330/124 R, 330/295

See application file for complete search history.

(56) References Cited

U.S. PATENT DOCUMENTS

| | | | | |
|---|---|---|---|---|
| 5,758,269 | A * | 5/1998 | Wu | H03F 1/0261 455/126 |
| 7,327,775 | B1 * | 2/2008 | Gu | H04B 1/707 375/130 |

(Continued)

FOREIGN PATENT DOCUMENTS

CN         101674052 A        3/2010

OTHER PUBLICATIONS

International Search Report and Written Opinion—PCT/US2015/045707—ISA/EPO—Nov. 20, 2015.

*Primary Examiner* — Edward Urban
*Assistant Examiner* — Max Mathew
(74) *Attorney, Agent, or Firm* — Procopio, Cory, Hargreaves & Savitch, LLP

(57) ABSTRACT

A dual stage LNA for use in multiband receivers is disclosed. In an exemplary embodiment, an apparatus includes a plurality of first stage amplifiers having a plurality of first stage output ports, respectively, to output first stage amplified voltage mode signals. The apparatus also includes a plurality of second stage amplifiers having a plurality of second stage input ports, respectively, and second stage output ports to output amplified current mode signals. The apparatus also includes a switch apparatus having input terminals connected to the first stage output ports and output terminals connected to the second stage input ports, the switch apparatus to connect selected second stage input ports to selected first stage output ports.

20 Claims, 8 Drawing Sheets

(56) References Cited

U.S. PATENT DOCUMENTS

| | | | |
|---|---|---|---|
| 8,008,970 B1* | 8/2011 | Homol | H03F 3/72 330/296 |
| 8,483,647 B2 | 7/2013 | Kaukovuori et al. | |
| 8,903,343 B2 | 12/2014 | Holenstein et al. | |
| 8,975,968 B2 | 3/2015 | Abdelhalem et al. | |
| 9,035,697 B2 | 5/2015 | Youssef et al. | |
| 9,059,665 B2 | 6/2015 | Youssef et al. | |
| 9,106,185 B2 | 8/2015 | Youssef et al. | |
| 9,124,228 B2 | 9/2015 | Xu et al. | |
| 9,154,356 B2 | 10/2015 | Tasic et al. | |
| 9,154,357 B2 | 10/2015 | Tasic et al. | |
| 9,160,598 B2 | 10/2015 | Davierwalla et al. | |
| 9,166,852 B2 | 10/2015 | Davierwalla et al. | |
| 9,178,669 B2 | 11/2015 | Fernando | |
| 2005/0012432 A1* | 1/2005 | Murphy | H01L 41/042 310/316.01 |
| 2008/0180168 A1* | 7/2008 | Itkin | H03F 1/0277 330/124 R |
| 2010/0090767 A1* | 4/2010 | Ohnishi | H03F 1/0272 330/277 |
| 2011/0300821 A1* | 12/2011 | Wang | H04B 1/18 455/232.1 |
| 2012/0322394 A1* | 12/2012 | Chien | H03H 11/1291 455/84 |
| 2012/0327825 A1 | 12/2012 | Gudem et al. | |
| 2013/0231064 A1 | 9/2013 | Gudem et al. | |
| 2013/0315348 A1 | 11/2013 | Tasic et al. | |
| 2014/0072001 A1 | 3/2014 | Chang et al. | |
| 2014/0113578 A1 | 4/2014 | Xu et al. | |
| 2014/0134960 A1 | 5/2014 | Tasic et al. | |
| 2014/0170999 A1 | 6/2014 | Aparin | |
| 2014/0240048 A1 | 8/2014 | Youssef et al. | |
| 2015/0084701 A1* | 3/2015 | Perreault | H03F 3/193 330/297 |
| 2015/0200690 A1 | 7/2015 | Youssef et al. | |
| 2015/0237583 A1 | 8/2015 | Hassan et al. | |
| 2015/0257022 A1 | 9/2015 | Kohlmann et al. | |

* cited by examiner

DUAL STAGE LOW NOISE AMPLIFIER FOR MULTIBAND RECEIVER

BACKGROUND

I. Field

The present disclosure relates generally to electronics, and more specifically to low noise amplifiers for multiband receivers.

II. Background

A wireless device (e.g., a cellular phone or a smartphone) in a wireless communication system may transmit and receive data for two-way communication. The wireless device may include a transmitter for data transmission and a receiver for data reception. For data transmission, the transmitter may modulate a radio frequency (RF) carrier signal with data to obtain a modulated RF signal, amplify the modulated RF signal to obtain an amplified RF signal having the proper output power level, and transmit the amplified RF signal via an antenna to a base station. For data reception, the receiver may obtain a received RF signal via the antenna and may amplify and process the received RF signal to recover data sent by the base station.

A wireless device may support operation over a wide frequency range. For example, the wireless device may support receiver (Rx) Carrier Aggregation (CA), which involves receiving an incoming RF signal that consists of an aggregate of two or more component carriers. The carrier aggregated RF signal needs to be down-converted using two or more distinct local oscillator (LO) frequencies, which typically requires a single input multiple out LNA for intra mode CA. Unfortunately, conventional LNA configurations utilize a large amount of circuit area and may suffer from degraded linearity.

It is desirable to have a dual stage low noise amplifier to support operation over a wide frequency range while reducing circuit area requirements over conventional LNAs and providing excellent linearity performance.

DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

Figure 1:
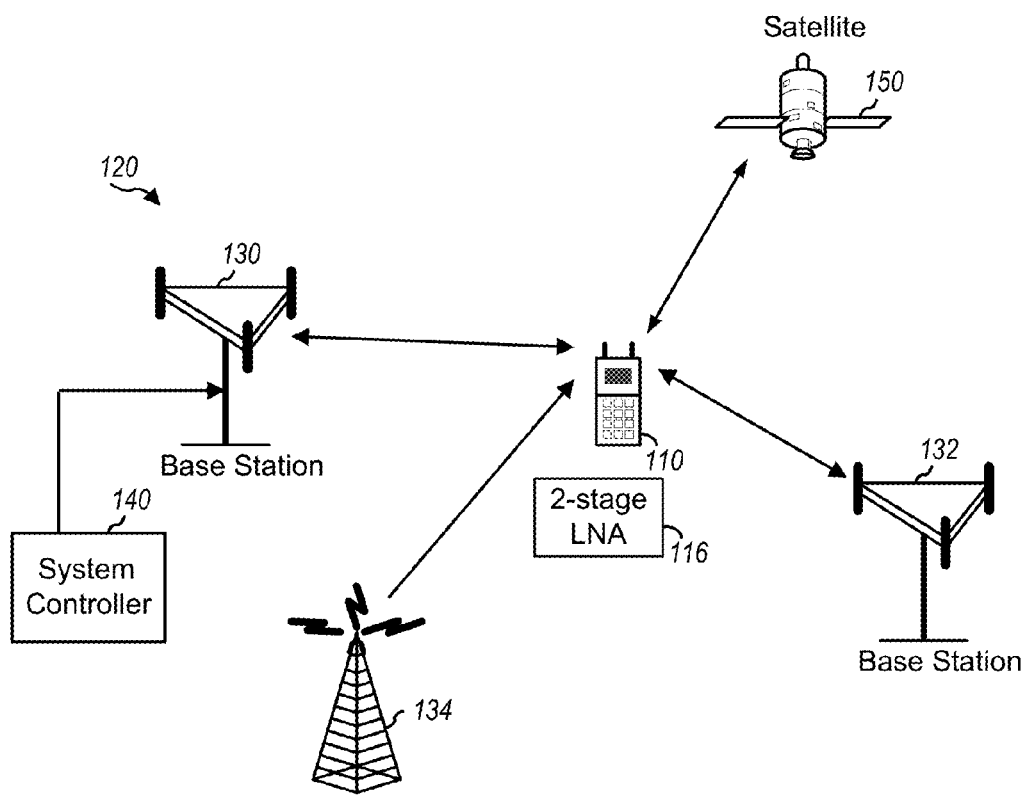
FIG. 1 shows an exemplary embodiment of a dual stage LNA in a wireless device communicating in a wireless communication system.

FIG. 1 shows an exemplary embodiment of a dual stage LNA 116 in a wireless device 110 communicating in a wireless communication system 100. Wireless system 100 may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1x, Evolution-Data Optimized (EVDO), Time Division Synchronous CDMA (TD-SCDMA), or some other version of CDMA. For simplicity, FIG. 1 shows the wireless device 110 in communication with base stations 102 and 104 and one system controller 106. In general, a wireless communication system may include any number of base stations and any set of network entities.

The wireless device 110 may also be referred to as user equipment (UE), a mobile station, a terminal, an access terminal, a subscriber unit, a station, etc. The wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, etc. The wireless device 110 may also receive signals from broadcast stations (e.g., a broadcast station 112), or signals from satellites (e.g., a satellite 108) in one or more global navigation satellite systems (GNSS). Wireless device 110 may support one or more radio technologies for wireless communication such as LTE, WCDMA, CDMA 1x, EVDO, TD-SCDMA. GSM, and/or 802.11.

In an exemplary embodiment, the dual stage LNA 116 operates to receive multiple signals and provide amplification before inputting multiple amplified signals to selected demodulators, for instance, as found in a carrier aggregation receiver. In various exemplary embodiments, the dual stage LNA operates to provide enhanced linearity and circuit area efficiency over conventional low noise amplifiers.

Figure 2:
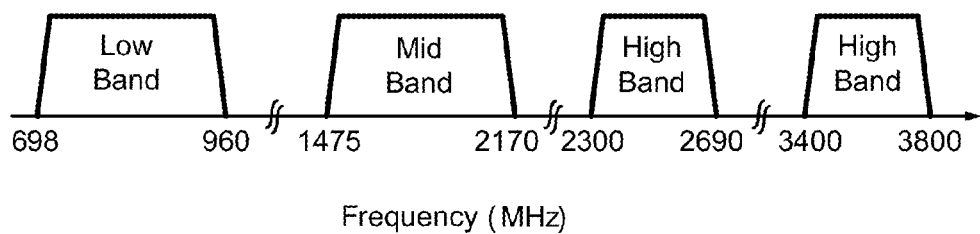
FIG. 2 shows exemplary frequency band groups in which the dual stage LNA of FIG. 1 is configured to operate.

FIG. 2 shows exemplary frequency band groups in which the dual stage LNA 116 of FIG. 1 is configured to operate. Wireless device 110 may be able to operate in a low-band (LB) covering frequencies lower than 1000 megahertz (MHz), a mid-band (MB) covering frequencies from 1000 MHz to 2300 MHz, and/or one or more high-bands (HB) covering frequencies higher than 2300 MHz. For example, the low-band may cover 698 to 960 MHz, the mid-band may cover 1475 to 2170 MHz, and the high-band may cover 2300 to 2690 MHz and 3400 to 3800 MHz, as shown in FIG. 2. Low-band, mid-band, and high-band refer to three groups of bands (or band groups), with each band group including a number of frequency bands (or simply, "bands"). Each band may cover up to 200 MHz. LTE Release 11 supports 35 bands, which are referred to as LTE/UMTS bands and are listed in 3GPP TS 36.101. The frequency graph show in FIG. 2 may be extended to show an LTEU band from 5.15 GHz to 5.85 GHz.

In general, any number of band groups may be defined. Each band group may cover any range of frequencies, which may or may not match any of the frequency ranges shown in FIG. 2. Each band group may also include any number of bands. In various exemplary embodiments, the dual stage LNA 116 is suitable for use with all the various band groups.

Figure 3:
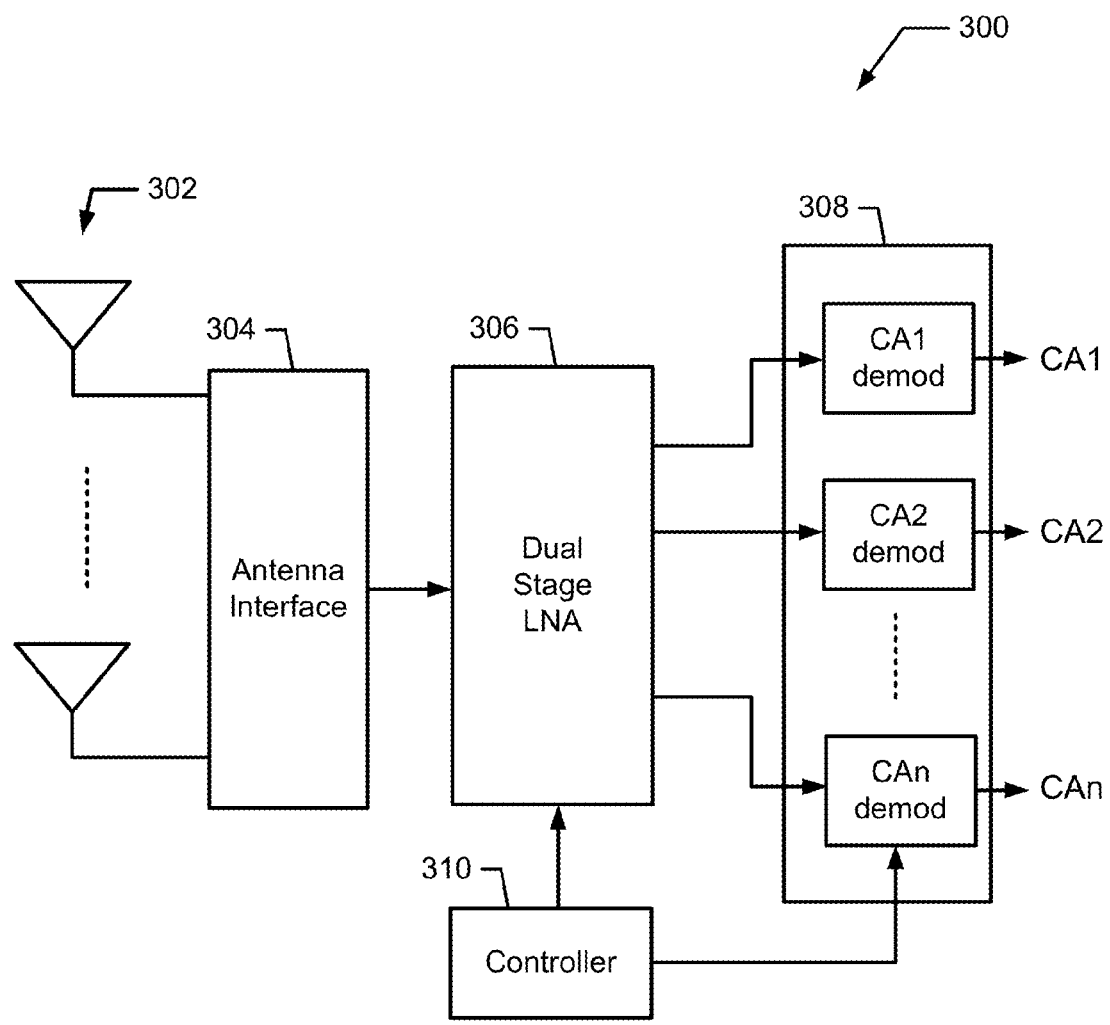
FIG. 3 shows a receiver that includes an exemplary embodiment of a dual stage LNA for use in a wireless device.

FIG. 3 shows a receiver 300 that includes an exemplary embodiment of a dual stage LNA 306 for use in a wireless device, such as the wireless device 110 shown in FIG. 1. The receiver 300 comprises one or more antennas 302, antenna interface 304, the dual stage LNA 306, demodulators 308, and a controller 310.

During operation, signals received by the antennas 302 are passed to the antenna interface 304. The signals comprise RF signals in any of the frequency bands described with reference to FIG. 2. The antenna interface 304 comprises matching circuits configured to provide impedance matching to enable the RF signals from the antennas 302 to be input to the dual stage LNA 306 with low loss or distortion.

The dual stage LNA 306 operates to amplify the, received RF signals and distribute the received RF signals to the modulators 308 under the control of a controller 310. For example, the controller 310 controls how the dual stage LNA 308 amplifies and directs signals to the demodulators 308. Thus, the dual stage LNA 308 operates to amplify RF signals received by one or more antennas and direct the amplified signals to a particular demodulator in a multiband receiver. In various exemplary embodiments, the dual stage LNA 306 is configured to provide enhanced linearity and circuit area savings.

The demodulators 308 operate to down converter the RF signals to baseband. The baseband signals may then be combined or otherwise processed at the receiving device. For example, in a carrier aggregation communication system, a baseband signal at a transmitter is divided into multiple baseband signal components that are modulated and transmitted using multiple carrier signals of different frequencies. At a receiving device, each carrier is received and demodulated to obtain its corresponding baseband signal component. These baseband signal components are then combined to form the original baseband signal.

Figure 4:
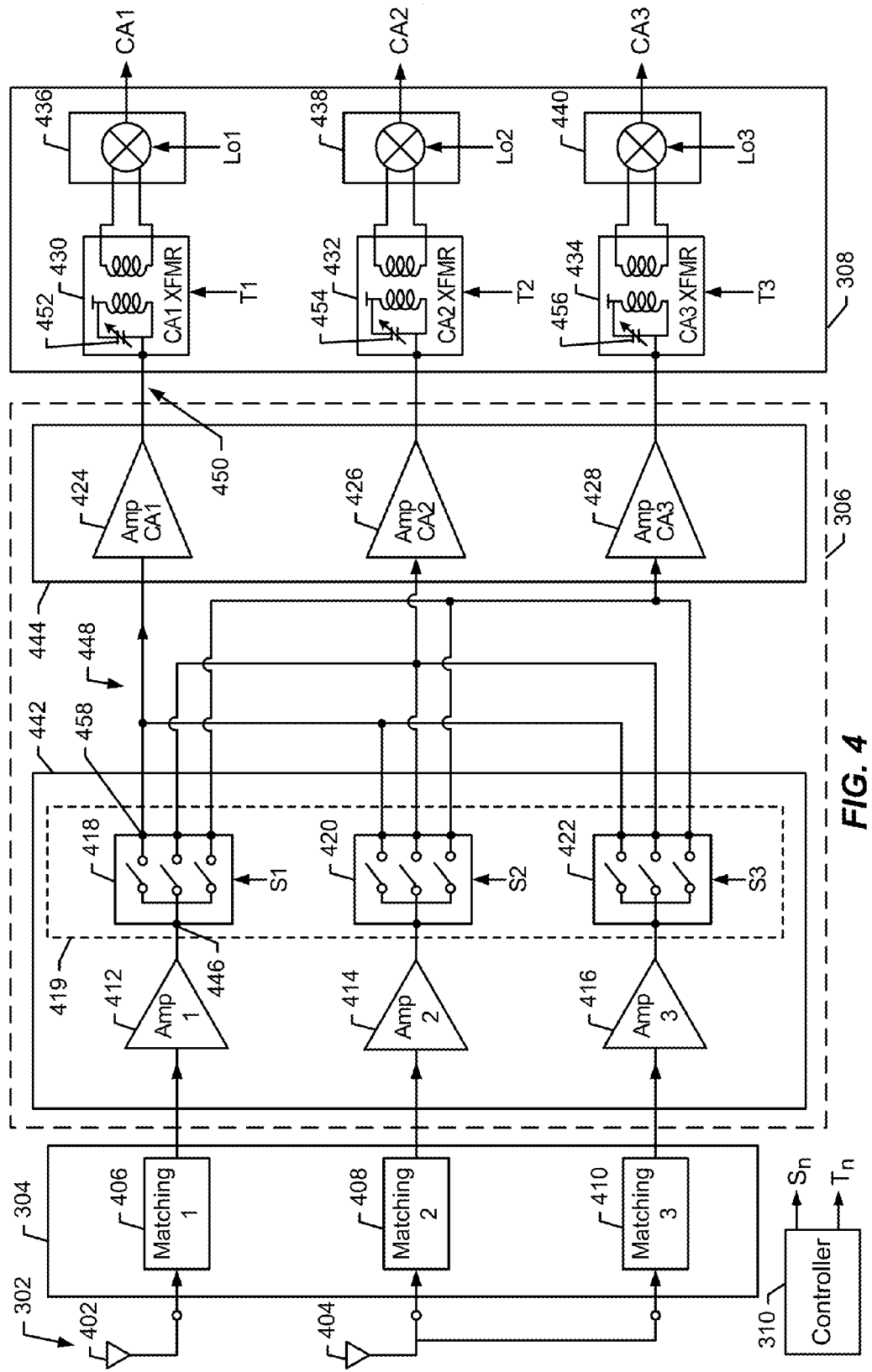
FIG. 4 shows a detailed exemplary embodiment of the receiver and dual stage LNA shown in FIG. 3.

FIG. 4 shows a detailed exemplary embodiment of the receiver 300 and dual stage LNA 306 shown in FIG. 3. The antennas 302 comprise antennas 402 and 404. The antenna interface 304 comprises matching circuits 406, 408, and 410. The demodulators 308 comprise adjustable transformers 430, 432, and 434 and down converters 436, 438, and 440. The dual stage LNA 306 comprises a first amplifier stage 442 and a second amplifier stage 444. The first amplifier stage 442 comprises amplifiers 412, 414, and 416, and a switch apparatus 419 comprising switches 418, 420, and 422. Each switch (418, 420, and 422) comprises one or more independently controllable switch devices. The second amplifier stage 444 comprises amplifiers 424, 426, and 428. The controller 310 operates to output switch control signals (Sn) to control the operation of the switches and transformer control signals (Tn) to tune the transformers to facilitate signal demodulation.

During operation, the antennas 402 and 404 receive RF signals comprising modulated data or other information signals. In an exemplary embodiment, the antennas 402, 404 are configured to receive various carriers in a communication system that utilizes carrier aggregation. Although two antennas are shown in FIG. 4, the dual stage LNA 306 is suitable for use with any number of antennas.

The antennas 402, 404 are connected to the matching circuits 406, 408, and 410. These matching circuits operate to match the RF signals from the antennas 402, 404 to input ports of the first stage amplifiers 442 of the dual stage LNA 306. In an exemplary embodiment, any number of first stage amplifiers can be utilized. The first stage amplifiers 442 amplify the received RF signals at their input ports and provide amplified signals at their output ports to the switches 418, 420, and 422. In the exemplary embodiment shown, the amplifier 412 amplifies signals from antenna 402 and the amplifiers 414 and 416 amplify signals from antenna 404. In an alternative embodiment, the amplifiers of the first stage amplifiers 442 amplify signals from the same antenna or different antennas.

The switches 418, 420, and 422 each have an input terminal and one or more output terminals. For example, the switch 418 has an input terminal 446 and an output terminal 458. In an exemplary embodiment, each switch comprises one or more independently controllable switch devices having their inputs connected to receive the same input signal. However, the switch devices provide independent outputs. In an exemplary embodiment, the input terminals of each switch (418, 420, and 422) are connected to one or more of their respective output terminals in response to switch control signals (S1-S3). Thus, the output ports of the amplifiers 412, 414, and 416 can be connected to one or more of the output terminals associated with the switches 418, 420 and 422, respectively, based on the received switch control signals (S1-S3).

The output terminals of the switches are connected to the input ports of amplifiers 424, 426, and 428 of the second amplifier stage 444. In an exemplary embodiment, the signals (indicated at 448) that flow over the connections between the outputs of the switches 418, 420, and 422 and the second amplifier stage 444 are voltage mode signals, such that the information is conveyed in the voltage levels and/or voltage changes associated with these signals. Since the signals 448 are voltage mode signals, the distance between the switches 412, 414, and 416 and the second stage amplifiers 424, 426, and 428 can be extended without significantly degrading the amplified signals flowing over these connections.

During operation, the controller 310 outputs switch control signals (S1-S3) to control the switches to connect their input terminals to one or more of their output terminals. This effectively distributes the amplified signals from the first stage amplifiers 412, 414, and 418 to the second stage amplifiers 424, 426, and 428. In an exemplary embodiment, any portion or all of the amplified signals output from the first stage amplifiers 412, 414, and 416 can be switched to become inputs to one or more of the second stage amplifiers 424, 426, and 428. For example, if the top switch of the switches 418, 420, and 422 are closed, then all the amplified outputs of the first stage amplifiers are switched to be input to the second stage amplifier 424. Accordingly, the switches 418, 420, and 422 can be configured to direct any of the first stage amplifier outputs to any of the second stage amplifier inputs.

The second stage amplifiers 444 operate to amplify the voltage mode signals at their input ports to produce amplified current mode signals at their output ports that are used to drive the transformer circuits 430, 432, and 434. For example, the signal 450 is a current mode signal output from the second stage amplifier 424 and input to the transformer 430. An output of the transformer 430 is input to a down converter 436 to generate base band data associated with a first carrier. The down converter 436 receives a local oscillator (LO1) signal that is used to down convert the current mode RF signal output from the transformer 430. The down converters 438 and 440 are similarly configured.

In an exemplary embodiment, the transformer circuits 430, 432, and 434 comprise tunable capacitors 452, 454, and 456 that allow the transformer performance to be tuned to a particular carrier frequency. The tunable capacitors 452, 454, and 456 are tuned based on receive transformer control signals (T1-T3) output from the controller 310. The outputs of the second stage amplifiers 444 are current mode signals such hat information is conveyed in the electrical current levels and/or current changes associated with these current signals. Since the amplified outputs of the second stage amplifiers 444 are current mode signals, these amplifiers can be placed very close to their corresponding transformer circuits to maintain excellent linearity. In contrast, the connections between the outputs of the switches 418, 420, and 422 and the inputs to the second stage amplifiers can be much longer in length as these connection carry voltage mode signals and therefore are less prone to linearity degradation. Accordingly, the first stage amplifiers 442 operate as band-centric amplifiers because they amplify signals in particular bands. The second stage amplifiers operate as carrier-centric amplifiers because they amplify signals associated with particular carriers that are to be demodulated.

In exemplary embodiments, the first stage amplifiers 442 and the second stage amplifiers 444 are implemented on one or more integrated circuits (IC). For example, in one aspect, the first stage amplifiers 442 and the switch apparatus 419 are implemented on a first IC and the second stage amplifiers 444 are implemented on a second IC. It should be noted that other implementations are possible. Because the signals 448 are voltage mode signals, the length of these connections can be longer than the length of the current mode signals 450 that flow over the connections between the outputs of the second stage amplifiers 444 and the transformer circuits 430, 432, and 434.

Figure 5:
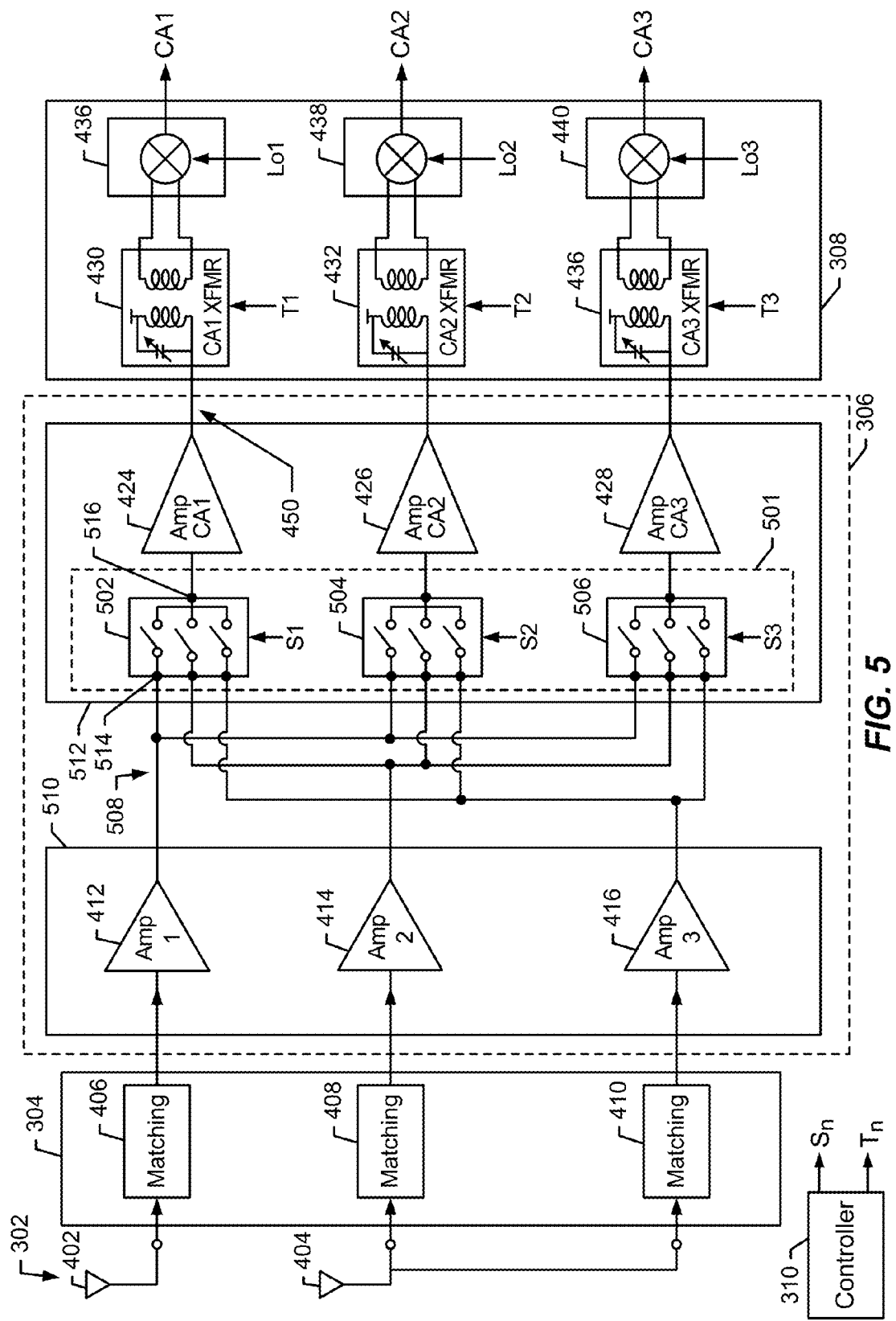
FIG. 5 shows a detailed exemplary alternative embodiment of the receiver and dual stage LNA shown in FIG. 3.

FIG. 5 shows an exemplary alternative embodiment of the dual stage LNA 306 shown in FIG. 4. As shown in FIG. 5, the dual stage LNA 306 comprises first stage amplifiers 510 and second stage amplifiers 512. The second amplifier stage 512 now includes switch apparatus 501 comprising switch 502, 504, and 506 that receive the voltage mode amplified output signals 508 from the first stage amplifiers 510. Each switch (502, 504, and. 506) comprises one or more independently controllable switch devices. The switches 502, 504, and 506 are controlled by the switch control signals (S1-S3) output from the controller 310. Each switch has multiple input terminals and one output terminal. For example, the switch 502 has input terminal 514 and output terminal 516. The input terminals are connected to receive the voltage mode amplified signals output from the first stage amplifiers 510. The output terminals of the switches pass the received voltage mode amplified signals to the input of the second stage amplifiers 424, 426, and 428. The second stage amplifiers 512 output amplified current mode signals that are input to corresponding transformer circuits 430, 432, and 434. For example, the signal 450 is an amplified current mode signal. Thus, the exemplary embodiment of the dual stage LNA 306 shown in FIG. 5 illustrates how the switch apparatus 501 that distribute the outputs of the first stage amplifiers can be moved from a first integrated circuit comprising the first stage amplifier circuit 510 to a second integrated circuit comprising the second stage amplifier circuit 512.

Figure 6:
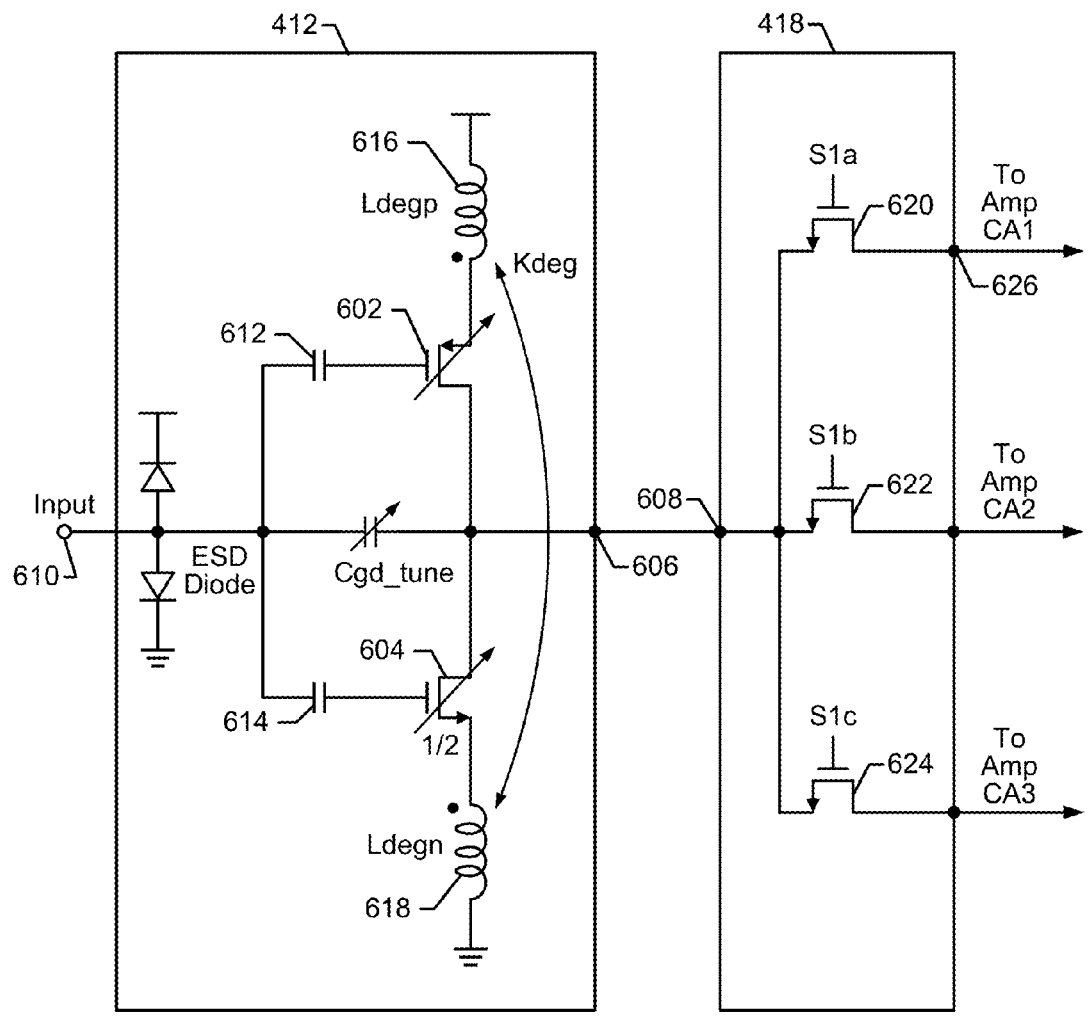
FIG. 6 shows an exemplary detailed embodiment of a first stage amplifier and a switch for use in the dual stage LNA shown in FIG. 4.

FIG. 6 shows an exemplary detailed embodiment of the amplifier 412 and switch 418 of the dual stage LNA 306 shown in FIG. 4. In this exemplary embodiment, the amplifier 412 comprises transistors 602 and 604 forming an inverting amplifier. An output terminal 606 of the amplifier 412 is connected to an input terminal 608 of the switch 418. The amplifier 412 receives an input at an input terminal 610 that is coupled through capacitors 612 and 614 to the gates of the transistors 602, 604. A first degeneration inductor 616 is connected between a supply line and a source terminal of the transistor 602. A second degeneration inductor 618 is connected between a signal ground and a source terminal of the transistor 604. The two degeneration inductors, 616 and 618 couple together with a mutual coupling co-efficient (Kdeg) to reduce circuit area.

The switch 418 comprises three transistor switch devices 620, 622, 624. The transistors are controlled by switch control line (S1a, S1b, and S1c) that are generated by the controller 310. If a switch is turned on then the signal at the input terminal 608 is passed to the output terminal associated with the turned on switch. For example if switch 620 is turned on by switch control line S1A, then the signal at the terminal 608 is pass to the switch output terminal 626. The switches are independently controllable so that any or all of the switches may be either on or off at any time depending on the state of the switch control lines (S1a-S1c). In this exemplary embodiment, the signals output from the switch 418 are voltage mode signals.

Figure 7:
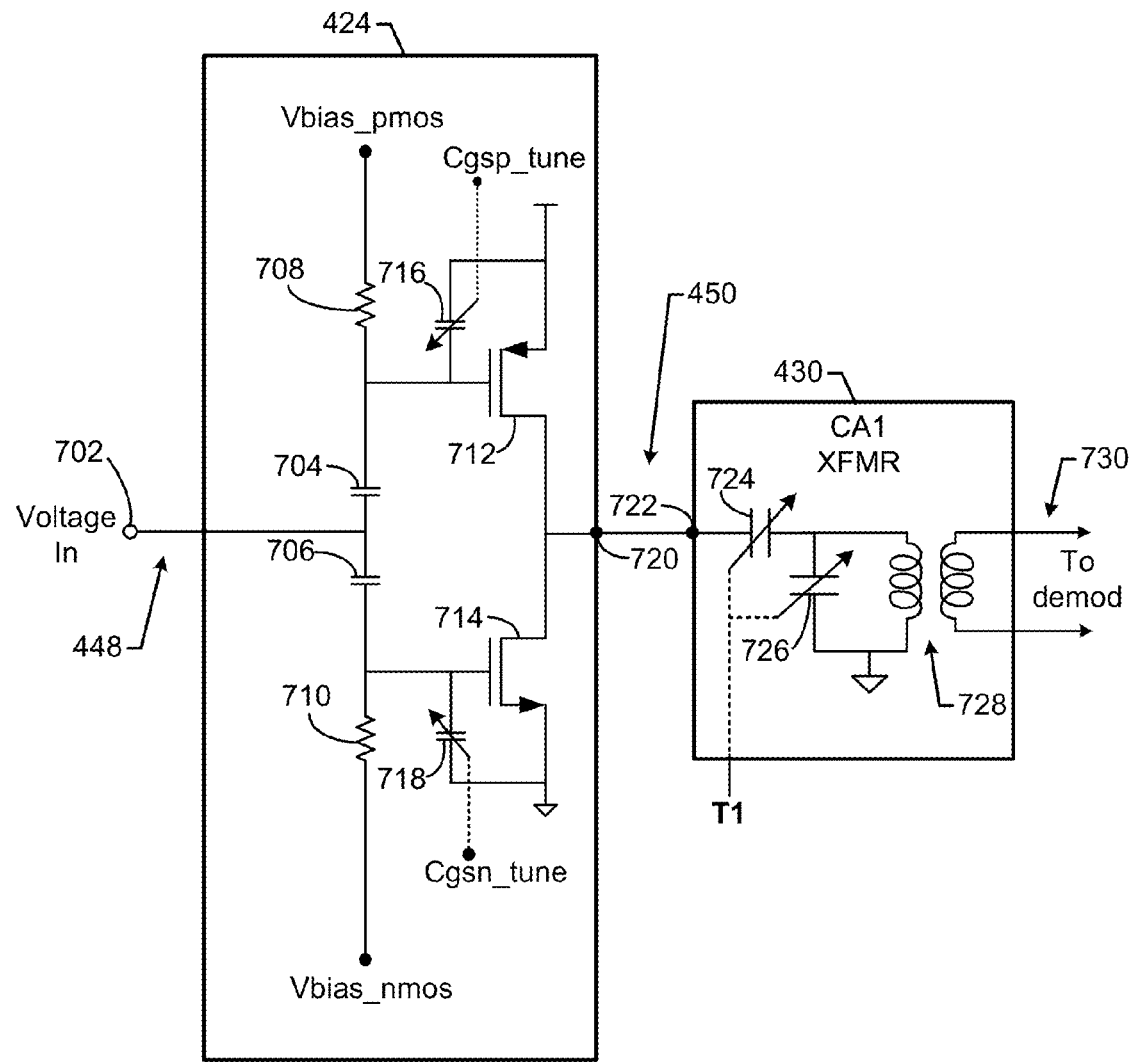
FIG. 7 shows an exemplary detailed embodiment of a second stage amplifier and a transformer for use in the dual stage LNA shown in FIG. 4.

FIG. 7 shows a detailed exemplary embodiment of the amplifier 424 and transformer circuit 430 shown in FIG. 4. In this exemplary embodiment, the amplifier 424 comprises transistors 712 and 714 forming an inverting amplifier that provides a current mode output signal at output terminal 720. The output terminal 720 of the amplifier 424 is connected to an input terminal 722 of the transformer 430. The amplifier 424 receives an input signal at an input terminal 702 that is coupled through capacitors 704 and 706 to the gates of the transistors 712 and 714. For example, in an exemplary embodiment, the input terminal 702 is connected to switch output terminal 458 as shown in FIG. 4, to receive a voltage mode signal for amplification.

A first resistor 708 is connected to the gate of transistor 712 to receive a first bias signal (Vbias_pmos). A second resistor 710 is connected to the gate of transistor 714 to receive a second bias signal (Vbias_nmos). A first tunable capacitor 716 is connected between the gate terminal and the source terminal of the transistor 712. The source terminal is further connected to a voltage supply. A second tunable capacitor 718 is connected between the gate terminal and the source terminal of the transistor 714. The source terminal is further connected to a signal ground. The tunable capacitors 716 and 718 receive tuning control signals Cgsp_tune and Cgsn_tune that are provide by another entity at the wireless device (not shown). The bias signals Vbias_pmos and Vbias_nmos are also provided by another entity at the wireless device (not shown). The tuning and bias signals are configured to control the amplifier 424 to operate in a desired operating mode.

The transformer 430 comprises tuning capacitors 724 and 726 and transformer 728. The series tuning capacitor 724 couples a current mode signal 450 at the input terminal 722 to the transformer 728. The series tunable capacitor 724 and shunt tunable capacitor 726 operate to tune the operation of the transformer 728 for the particular frequency of interest. The capacitors 724 and 726 are tunable by tuning signals provided in the transformer control signal (T1) that is generated by the controller 310. The transformer 728 provides output signals 730 to a downstream demodulator.

Figure 8:
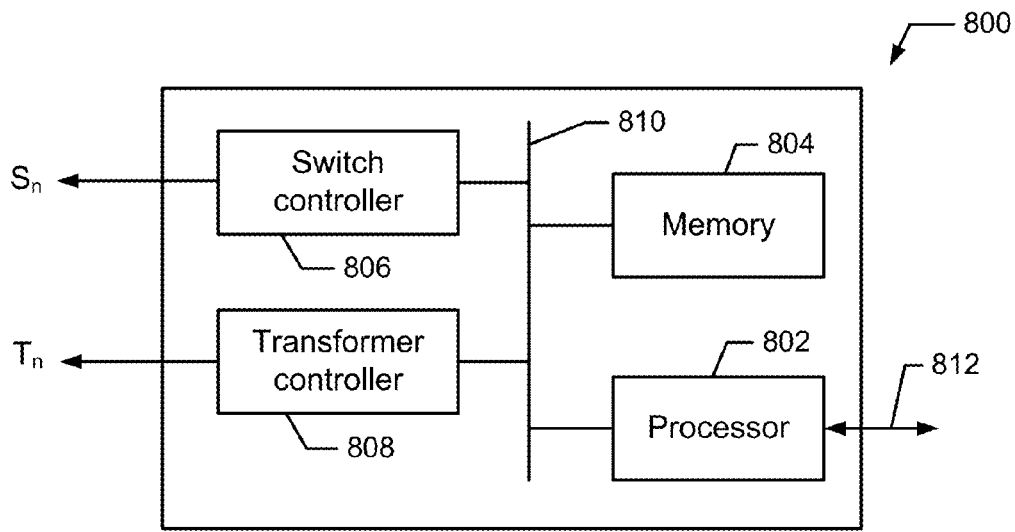
FIG. 8 shows an exemplary embodiment of a controller for use with a dual stage LNA shown in FIG. 4.

FIG. 8 shows an exemplary embodiment of a controller 800 for use with the dual stage LNA 306 shown in FIG. 4 or FIG. 5. For example, the controller 800 is suitable for use as the controller 310 shown in FIG. 4 or FIG. 5. The controller 800 comprises processor 802, memory 804, switch controller 806, and transformer controller 808 all coupled to communicate over communication bus 810.

The processor 802 comprises at least one of a CPU, processor, gate array, hardware logic, discrete circuits, memory elements, and/or hardware executing software. The processor 802 operates to control the other functional elements of the controller 800 using the communication bus 810. The processor 802 can execute instructions stored in the memory 804 or operate in accordance with instructions, commands, data, or other information received over a processor control line 812. In an exemplary embodiment, another entity (not shown) at the device generates the information on the processor control line 812.

The memory 804 comprises any suitable memory or storage device that allows for storing, retrieving, and maintaining instructions and/or data associated with the operation of the controller 800. In an exemplary embodiment, the memory 804 stores algorithm instructions that can be executed by the processor 802 to perform the functions of the dual stage LNA as described herein.

The switch controller 806 comprises hardware, such as amplifiers, buffers, registers, gates, transistors, analog to digital converters, digital to analog converters or any other suitable hardware or discrete components and/or hardware executing software that operates to output switch control signals (Sn) to the switches used in the various exemplary embodiments described above. For example, the processor 802 operates to determine switch settings for one or more of the switches used in the various embodiments and passes these switch settings to the switch controller 806. The switch controller 806 outputs switch control signals (Sn) to the designated switches to adjust their switch settings according to the determinations made by the processor 802. In an exemplary embodiment, the processor 802 determines that the switch settings of the switches 418, 420, 422 are to be changed to new switch settings. The processor 802 sends the new switch settings to the switch controller 806 which outputs the switch control signals (Sn) to the switches 418, 420, 422 to set the new switch settings. In an exemplary embodiment, the switch controller 806 is configured to output analog and/or digital switch control signals as necessary.

The transformer controller 808 comprises hardware, such as amplifiers, buffers, registers, gates, transistors, analog to digital converters, digital to analog converters or any other suitable hardware or discrete components and/or hardware executing software that operates to output transformer control signals (Tn) to tune the operation of the transformer circuits 430, 432, and 434. For example, the processor 802 operates to determine operating parameters (e.g., frequency tunings) for each of the transformer circuits and passes these adjustments to the transformer controller 808. The transformer controller 808 outputs transformer control signals (Tn) to adjust the operation of the transformer circuits according to the determinations made by the processor 802.

It should be noted that the controller 800 represents just one implementation and that other implementations are possible. For example, the controller 800 may be implemented in discrete logic that eliminates the need for a processor or memory devices. In another implementation, the functions and/or implementations of the controller 800 are incorporated or integrated into a baseband processor or other entity at the receiving device.

Figure 9:
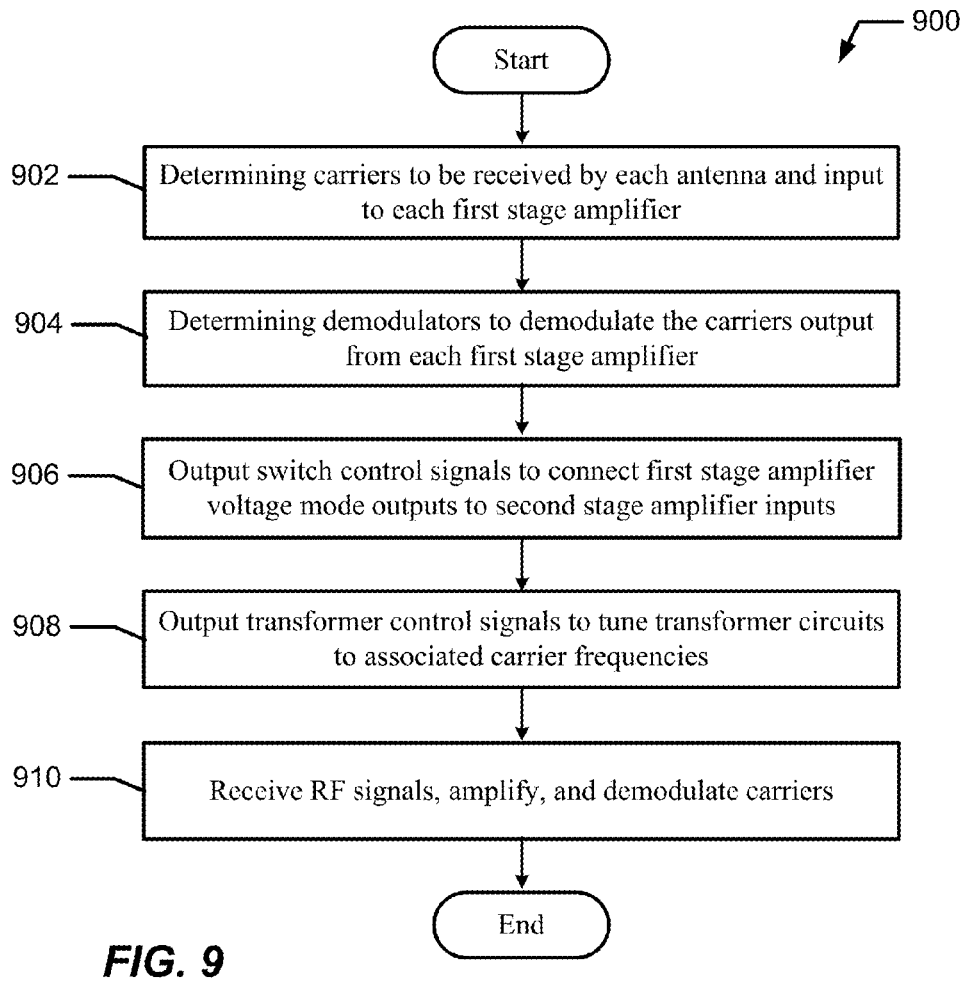
FIG. 9 shows an exemplary embodiment of a method for amplification in a multiband receiver.

FIG. 9 shows an exemplary method 900 for providing amplification in a multiband receiver. For example, the method 900 is suitable for use with the receiver 300 comprising the dual stage LNA 306 shown in FIG. 4.

At block 902, a determination is made to identify the carrier signals to be received by each antenna 302 and input to the first stage amplifiers 442 using the appropriate matching networks 304. For example, the processor 802 receives information over control interface 812 that identifies the carrier signals to be received and the antennas to be used to receive those carrier signals. The processor also has knowledge of how the antennas are connected through the matching networks 304 to the inputs of the first amplifier stage 442.

At block 904, a determination is made as to the demodulators 308 to he used to demodulate the received carrier signals. For example, the processor 802 receives information over control interface 812 that indicates which demodulators are to he used to demodulate the carrier signals to be received.

At block 906, switch control signals are generated and output to control how the voltage mode outputs from the first amplifier stage 442 amplifiers are input to the second amplifier stage 444 amplifiers. The processor 802 controls the switch controller 806 to output the switch control signals (Sn) to control the operation of the switches 418, 420, and 422 to connect the first stage amplifier voltage mode output signals 448 to the second stage amplifier 444 inputs. The switches 418, 420, and 422 are controlled so that the first stage amplified outputs are connected to the appropriate second stage amplifier inputs so that the carrier signals in the first amplifier stage outputs are amplified by the appropriate second stage amplifiers and routed to the correct demodulators.

At block 908, transformer control signals are generated and output to tune the transformer circuits 430, 432, and 434 to operate at the desired frequencies based on the carrier signals to be demodulated by each demodulator. In an exemplary embodiment, the processor 802 controls the transformer controller 808 to output the transformer control signals (Tn) to tune the variable capacitors 452, 454, and 456 so that operation of the transformers 430, 432, and 434 is tuned to receive the second stage amplifier current mode output signals 450 and convey these signals from the transformers to the demodulators 436, 439, and 440. In an exemplary embodiment, the transformer control signals (Tn) control both the series tunable capacitor 724 and the shunt tunable capacitor 726 of each transformer circuit.

At block 910, RF signals are received and demodulated when the RF signals received at the antennas 302 are amplified by the first amplifier stage 442 to generate amplified voltage mode signals that are input to the switches 418, 420, and 422. The switches are controlled by the switch control signals (Sn) to connect the amplified voltage mode signals to the appropriate inputs of the second amplifier stage 444. The second stage amplifiers output amplified current mode signals that are input to the transformer circuits 430, 432, and 434, which are tune to operate at the appropriate frequency of the carrier signals to be demodulated. The outputs of the transformer circuits are input to the demodulators 436, 438, and 440 to be down converted to obtain the desired baseband signals.

Figure 10:
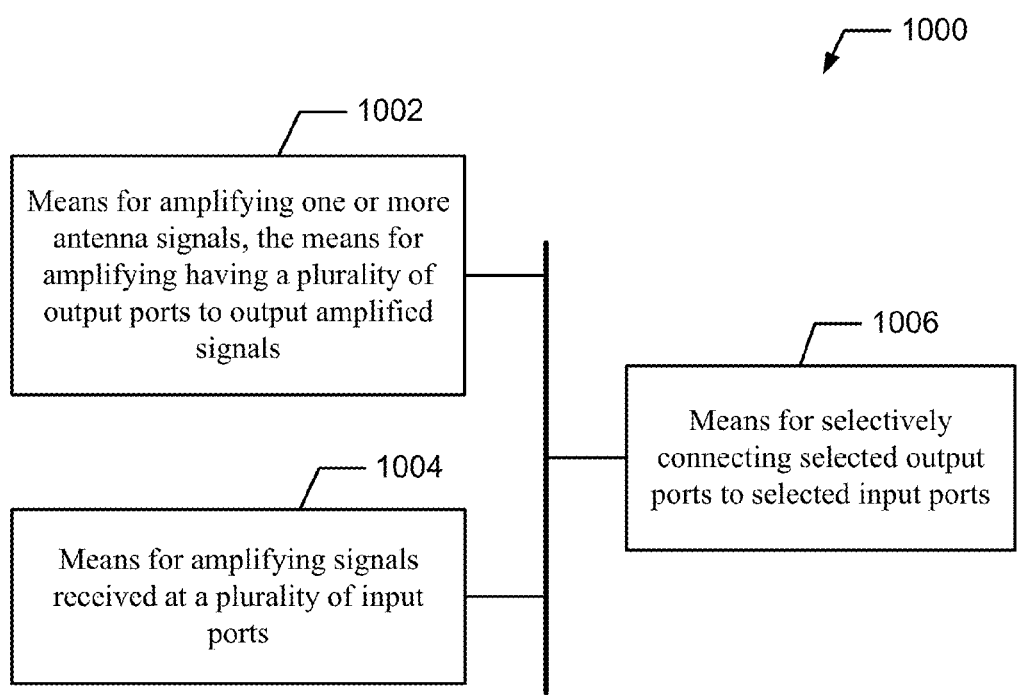
FIG. 10 shows an exemplary apparatus configured for dual stage amplification in a multiband receiver.

FIG. 10 shows an exemplary apparatus 1000 configured for dual stage amplification in a wireless device. In an exemplary embodiment, the apparatus 1000 comprises a first means (1002) for amplifying one or more antenna signals, the means for amplifying having a plurality of output ports to output amplified signals. The apparatus 1000 also comprises a second means (1004) for amplifying signals received at a plurality of input ports. The apparatus 1000 also comprises a third means (1006) for selectively connecting selected output ports to selected input ports.

The exemplary embodiments of a dual stage LNA described herein may be implemented on an IC, an analog IC, an RFIC, a mixed-signal IC, an ASIC, a printed circuit board (PCB), an electronic device, etc. The dual stage LNA may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing a dual stage LNA described herein may be a stand-alone device or may be part of a larger device. A device may be (i) a stand-alone IC, (ii) a set of one or more ICs that may include memory ICs for storing data and/or instructions, (iii)) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but the disclosure is to be accorded the widest scope consistent with the principles and novel features disclosed herein.

What is claimed is:

1. An apparatus comprising:
a plurality of first stage amplifiers having a plurality of first stage output ports, respectively, to output first stage amplified voltage mode signals;
a plurality of second stage amplifiers having a plurality of second stage input ports, respectively, and second stage output ports to output amplified current mode signals; and
a switch apparatus having input terminals coupled to the first stage output ports and output terminals coupled to the second stage input ports, the switch apparatus configured to couple selected first stage output ports to selected second stage input ports,
wherein the switch apparatus is configured such that at least one of the plurality of first stage output ports may be selectively coupled to any of multiple input ports of the plurality of second stage input ports.

2. The apparatus of claim 1, the switch apparatus operable in response to a control signal.

3. The apparatus of claim 2, the switch apparatus comprising a plurality of switches, and the control signal comprising a plurality of control signals coupled to the plurality of switches, respectively.

4. The apparatus of claim 3, each of the plurality of switches comprises a plurality of independently controllable switch devices that are independently controlled by the control signals.

5. The apparatus of claim 2, further comprising a controller to generate the control signal.

6. The apparatus of claim 1, each second stage amplifier configured to receive a voltage signal and generate an amplified current mode signal.

7. The apparatus of claim 1, each second stage output port coupled to a transformer having a transformer output.

8. The apparatus of claim 7, the first stage output ports are coupled to the second stage input ports by voltage mode signal paths that are longer than current mode signal paths between the second stage output ports and the transformers.

9. The apparatus of claim 7, each transformer output coupled to a demodulator.

10. The apparatus of claim 9 each demodulator tuned to demodulate a selected carrier frequency.

11. The apparatus of claim 1, the first and second stage amplifiers comprising inverter amplifiers.

12. The apparatus of claim 1, the first stage amplifiers and the switch apparatus formed on a first integrated circuit and the second stage amplifiers formed on a second integrated circuit.

13. The apparatus of claim 1, the first stage amplifiers formed on a first integrated circuit and the switch apparatus and the second stage amplifiers formed on a second integrated circuit.

14. The apparatus of claim 1, further comprising a plurality of matching circuits, each matching circuit having an input port coupled to a selected antenna and an output port connected to a selected first stage amplifier input port.

15. The apparatus of claim 1, the first stage amplifiers operates as band-centric amplifiers to amplify signal bands having one or more carrier signals and each second stage amplifier operates as a carrier-centric amplifier to amplify a respective carrier signal.

16. The apparatus of claim 1, the plurality of first stage amplifiers comprise one first stage amplifier for each signal band to be amplified and the plurality of second stage amplifiers comprise one second stage amplifier for each carrier signal to be amplified.

17. The apparatus of claim 2, the switch apparatus being operable in response to the control signal to connect each of the second stage input ports to all of the first stage output ports.

18. An apparatus comprising:
   first means for amplifying one or more signals, the first means for amplifying having a plurality of first stage output ports to output one or more amplified voltage mode signals;
   second means for amplifying one or more voltage mode signals received at a plurality of second stage input ports and outputting one or more current mode signals; and
   means for selectively coupling selected first stage output ports to selected second stage input ports,
   the means for selectively coupling comprising means for selectively coupling at least one of the plurality of first stage output ports to any of multiple input ports of the plurality of second stage input ports.

19. The apparatus of claim 18, the means for selectively coupling couples each of the first stage input ports to all the second stage output ports.

20. The apparatus of claim 18, the means for selectively coupling is configured to operate in response to a control signal.

* * * * *